(12) United States Patent
Katou et al.

(10) Patent No.: US 10,903,202 B2
(45) Date of Patent: Jan. 26, 2021

(54) SEMICONDUCTOR DEVICE (71) Applicant: KABUSHIKI KAISHA TOSHIBA, Tokyo (JP)

(72) Inventors: Hiroaki Katou, Nonoichi Ishikawa (JP); Masatoshi Arai, Hakusan Ishikawa (JP); Chikako Yoshioka, Kanazawa Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/189,473

(22) Filed: Nov. 13, 2018

(65) Prior Publication Data

US 2019/0081030 A1 Mar. 14, 2019

Related U.S. Application Data (62) Division of application No. 15/057,046, filed on Feb. 29, 2016, now abandoned.

(30) Foreign Application Priority Data

Aug. 10, 2015 (JP) .................................. 2015-158364

(51) Int. Cl.
*H01L 27/02* (2006.01)
*H01L 29/78* (2006.01)
(Continued)

(52) U.S. Cl.
CPC .... *H01L 27/0211* (2013.01); *H01L 21/26513* (2013.01); *H01L 27/088* (2013.01);
(Continued)

(58) Field of Classification Search
CPC ............. H01L 27/0211; H01L 29/7813; H01L 27/088; H01L 27/66712; H01L 21/26513; H01L 29/1095

See application file for complete search history.

(56) References Cited

U.S. PATENT DOCUMENTS 7,723,231 B2 * 5/2010 Fukui ................ H01L 21/28518
438/682
8,482,061 B2 7/2013 Nishimura
(Continued)

FOREIGN PATENT DOCUMENTS

CN 102856182 A 1/2013
CN 102856382 A 1/2013
(Continued)

OTHER PUBLICATIONS

CMOS Circuit Design, Layout, and Simulation, Jacob Baker, 2005, Wiley-IEEE Press, Second Edition, p. 166-167, ISBN-13:978-0471700555.

(Continued)

*Primary Examiner* — Charles D Garber
*Assistant Examiner* — S M Sohel Imtiaz
(74) *Attorney, Agent, or Firm* — Kim & Stewart LLP (57) ABSTRACT

A semiconductor device includes a first semiconductor region of a first conductivity type, a plurality of second semiconductor regions of a second conductivity type, each comprising a first part, on the first semiconductor region, wherein the second semiconductor regions are spaced apart in a first direction, a third semiconductor region of the first conductivity type on each of the second semiconductor regions, an insulation portion between two of the second semiconductor regions, the insulation portion having one side in contact with one of the first parts and the other side in contact with one of the third semiconductor regions, a first electrode within the insulation portion, a gate electrode spaced apart from the first electrode and within the insulation portion, and a second electrode on the third semiconductor region and electrically connected to the first electrode and the third semiconductor region.

9 Claims, 6 Drawing Sheets

(51) Int. Cl.
*H01L 27/088* (2006.01)
*H01L 29/10* (2006.01)
*H01L 29/66* (2006.01)
*H01L 21/265* (2006.01)
*H01L 29/06* (2006.01)
*H01L 29/40* (2006.01)
*H01L 29/08* (2006.01)
*H01L 29/417* (2006.01)

(52) U.S. Cl.
CPC ...... *H01L 29/0649* (2013.01); *H01L 29/0865* (2013.01); *H01L 29/1095* (2013.01); *H01L 29/407* (2013.01); *H01L 29/66712* (2013.01); *H01L 29/66734* (2013.01); *H01L 29/7813* (2013.01); *H01L 29/41766* (2013.01)

(56) References Cited

U.S. PATENT DOCUMENTS

| | | | |
|---|---|---|---|
| 8,866,220 B2 | 10/2014 | Kobayashi | |
| 8,889,532 B2 | 11/2014 | Burke et al. | |
| 8,952,450 B2 | 2/2015 | Nishimura | |
| 9,178,050 B2 | 11/2015 | Higuchi et al. | |
| 9,184,285 B2 | 11/2015 | Katou et al. | |
| 9,349,826 B2 | 5/2016 | Nishimura | |
| 9,601,334 B2 | 3/2017 | Nishimura | |
| 2001/0048132 A1* | 12/2001 | Ito | H01L 29/7813 257/330 |
| 2008/0044991 A1 | 2/2008 | Fukui | |
| 2008/0079069 A1* | 4/2008 | Suekawa | H01L 29/0847 257/330 |
| 2012/0241854 A1 | 9/2012 | Ohta et al. | |
| 2012/0326227 A1* | 12/2012 | Burke | H01L 29/7811 257/330 |
| 2013/0001592 A1 | 1/2013 | Miyahara et al. | |
| 2013/0062688 A1* | 3/2013 | Kobayashi | H01L 29/0878 257/330 |
| 2013/0248995 A1 | 9/2013 | Nishiwaki et al. | |
| 2013/0248998 A1* | 9/2013 | Misu | H01L 29/872 257/335 |
| 2013/0334598 A1* | 12/2013 | Okumura | H01L 29/0607 257/335 |
| 2015/0179764 A1 | 6/2015 | Okumura | |
| 2015/0311313 A1* | 10/2015 | Gan | H01L 29/0692 257/288 |
| 2016/0027916 A1 | 1/2016 | Katou et al. | |
| 2017/0141114 A1* | 5/2017 | Kanno | H01L 29/0623 |

FOREIGN PATENT DOCUMENTS

| | | |
|---|---|---|
| CN | 103489913 A | 1/2014 |
| JP | 2013069791 A | 4/2013 |

OTHER PUBLICATIONS

Japanese Office Action filed Jun. 26, 2018 in counterpart Japanese Patent Application No. 2015-158364, 11 pages (with machine translation).

Chinese Office Action dated Jul. 4, 2018, filed in Chinese counterpart Application No. 201610025310.8, 22 pages (with translation).

* cited by examiner

SEMICONDUCTOR DEVICE

CROSS-REFERENCE TO RELATED APPLICATIONS

This application is a division of U.S. patent application Ser. No. 15/057,046, filed on Feb. 29, 2016, which is based upon and claims the benefit of priority from Japanese Patent Application No. 2015-158364, filed Aug. 10, 2015, the entire contents of each of which are incorporated herein by reference.

FIELD

Embodiments described herein relate generally to a semiconductor device.

BACKGROUND

A semiconductor device such as a metal oxide semiconductor field effect transistor (MOSFET) is used to control electric power, for example. Such a semiconductor device is used for various purposes, including uses under a high temperature environment.

However, there is a concern that the semiconductor device might break as a result of stresses caused by heat, when the semiconductor device is used under the high temperature environment.

DETAILED DESCRIPTION

Embodiments provide a semiconductor device capable of suppressing heat-caused breakage.

In general, according to one embodiment, a semiconductor device includes a first semiconductor region of a first conductivity type, a plurality of second semiconductor regions of a second conductivity type, each comprising a first part, on the first semiconductor region, wherein the second semiconductor regions are spaced apart in a first direction and extend in a second direction crossing the first direction, a third semiconductor region of the first conductivity type on each of the second semiconductor regions, the third semiconductor regions extending in the second direction parallel to the first parts, an insulation portion between two of the second semiconductor regions, the insulation portion having one side in contact with one of the first parts and the other side in contact with one of the third semiconductor regions, a first electrode separated from the first semiconductor region in the first direction by the insulation portion, a gate electrode spaced apart from the first electrode, and separated from the second semiconductor region in the first direction by the insulation portion, and a second electrode on the third semiconductor region, and electrically connected to the first electrode and the third semiconductor region.

Hereinafter, the embodiments will be described with reference to drawings.

Moreover, the drawings are schematic or conceptual, a relationship between a thickness and a width of each part, and a ratio in size between the parts are not always the same as those in an actual semiconductor device. Also, even when the same two parts are described, one part may be illustrated in different size or ratio from the other part.

In addition, in this specification and each drawing, the same components as illustrated in the previous drawings are given the same reference numbers and a detailed description thereof will not be repeated.

Each of the embodiments will be described with reference to an XYZ orthogonal coordinate system. Two directions intersecting with each other in a direction parallel to a surface of the semiconductor layer S are respectively set to an X-direction (second direction) and a Y-direction (third direction), and a direction perpendicular to both of the X-direction and the Y-direction is set to a Z-direction (first direction).

In a description hereinafter, $n^+$, $n^-$, and $p^+$, $p$ indicate relative high and low levels of an impurity concentration in each of conductivity types. That is, the $n^+$ indicates an n-type impurity concentration relatively higher than the $n^-$. In addition, the $p^+$ indicates a p-type impurity concentration relatively higher than the p.

In each of the embodiments described hereinafter, a p-type and an n-type of each of semiconductor regions may be reversed, and this may be applied to each of the embodiments.

First Embodiment

Figure 1:
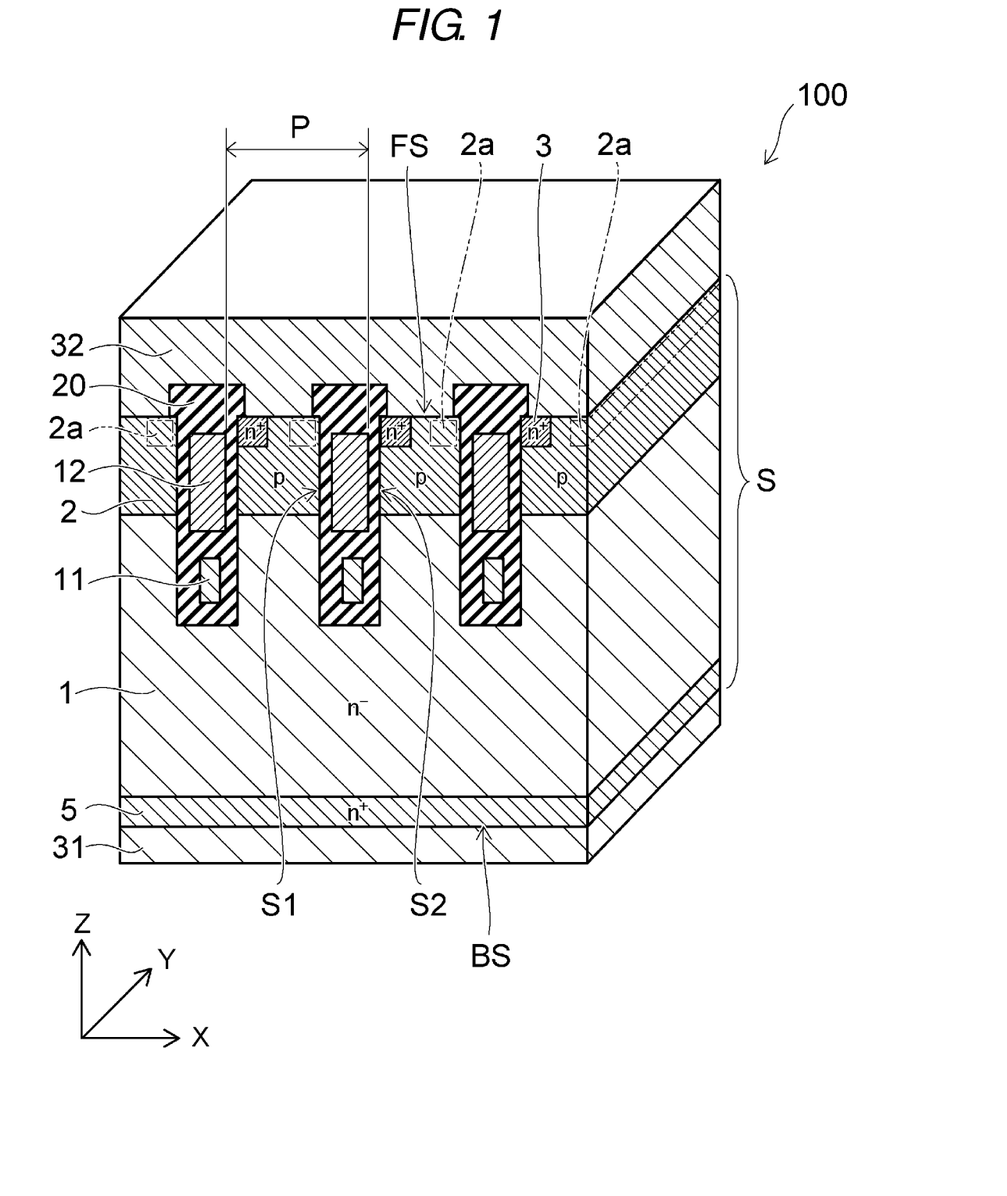
FIG. 1 is a perspective sectional view illustrating a part of a semiconductor device according to a first embodiment.

An example of a semiconductor device according to a first embodiment will be described with reference to FIG. 1. FIG. 1 is a perspective sectional view illustrating apart of a semiconductor device 100 according to the first embodiment.

The semiconductor device 100 is, for example, a MOSFET. The semiconductor device 100 includes an $n^+$ type (first conductivity type) drain region 5, an $n^-$ type semiconductor region 1 (first semiconductor region), a p type (second conductivity type) base region 2 (second semiconductor region), an $n^+$ type source region 3 (third semiconductor region), an insulation portion 20, a field plate electrode 11 (first electrode), a gate electrode 12, a drain electrode 31, and a source electrode 32 (second electrode).

The source electrode 32 is provided on a front surface FS of a semiconductor layer S. The drain electrode 31 is formed on a back surface BS of the semiconductor layer S.

The $n^+$ type drain region 5 is provided on the back surface BS side of the semiconductor layer S. The $n^+$ type drain region 5 is electrically connected to the drain electrode 31.

The $n^-$ type semiconductor region 1 is provided on the $n^+$ type drain region 5.

The $p^-$ type base region 2 is selectively provided on the $n^-$ type semiconductor region 1. A plurality of $p^-$ type base regions 2 are formed spaced apart in the X-direction, and each of the $p^-$ type base regions 2 extends in a Y-direction.

The $p^-$ type base region 2 includes a first part 2a provided on the front surface FS side. A p-type impurity concentration of the first part 2a may be equal to or higher than the p-type impurity concentration of the other part of the p⁻ type base region 2.

The n⁺ type source region 3 is selectively provided on the p⁻ type base region 2. A plurality of n⁺ type source regions 3 are provided spaced apart in the X-direction, and each of the n⁺ type source regions 3 extends in the Y-direction.

The n⁺ type source region 3 and the first part 2a of the p⁻ type base region 2 are arranged in the X-direction and extend in the Y direction parallel with each other. The first part 2a and the n⁺ type source region 3 are alternately arranged in the X-direction.

The field plate electrode (hereinafter, refer to as FP electrode) 11 and the gate electrode 12 are surrounded by the insulation portion 20 in an X-Z plane direction.

The FP electrode 11 is surrounded by the n⁻ type semiconductor region 1 through the insulation portion 20 in an X-Z plane direction.

The gate electrode 12 is provided over the FP electrode 11, and faces the p⁻ type base region 2 through the insulation portion 20 in the X-direction. The gate electrode 12 is spaced from the FP electrode 11 in a Z-direction (direction from n⁻ type semiconductor region 1 toward p⁻ type base region 2).

The FP electrode 11, the gate electrode 12, and the insulation portion 20 are provided in multiple in the X-direction, and each of these electrodes extends in the Y-direction.

The insulation portion 20 includes a first surface S1 and a second surface S2 opposite the first surface S1. The first surface S1 and the second surface S2 are respectively along the Y-direction and the Z-direction. A part of the first surface S1 comes into contact with the first part 2a, and apart of the second surface S2 comes into contact with the n⁺ type source region 3.

On the p⁻ type base region 2, the n⁺ type source region 3, and the insulation portion 20, a source electrode 32 is provided. The source electrode 32 is electrically connected to the p⁻ type base region 2, the n⁺ type source region 3, and the FP electrode 11.

In a state in which a positive voltage with respect to the source electrode 32 is applied to the drain electrode 31, a MOSFET is turned on by applying a voltage equal to or more a threshold to the gate electrode 12. At this time, a channel (reverse layer) is formed on a region near the insulation portion 20 of the p⁻ type base region 2.

When the MOSFET is turned off and a negative potential is applied to the drain electrode 31 with respect to a potential of the source electrode 32, a depletion layer broadens from an interfacial surface between the insulation portion 20 and the n⁻ type semiconductor region 1 toward the n⁻ type semiconductor region 1. This is because of the FP electrode 11 connected to the source electrode 32 is provided under the gate electrode 12. The broadening of the depletion layer from the interfacial surface of the insulation portion 20 and the n⁻ type semiconductor region 1 causes an increase in the breakdown voltage increased.

Next, an example of a manufacturing method of the semiconductor device 100 according to the first embodiment will be described with reference to FIG. 2A to FIG. 3B.

FIG. 2A to FIG. 3B are cross-sectional views illustrating the results of steps of a manufacturing process of the semiconductor device 100 according to the first embodiment.

Figure 2A:
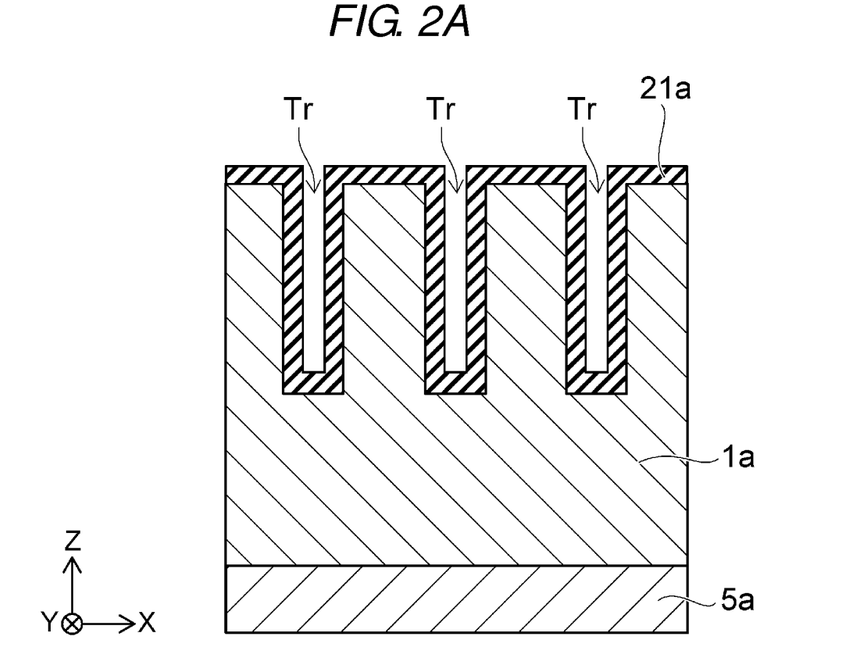
FIGS. 2A and 2B are cross-sectional views illustrating results of the manufacturing process of the semiconductor device according to the first embodiment.

First, a semiconductor substrate in which the n⁻ type semiconductor layer 1a is provided on the n⁺ type semiconductor layer 5a is prepared. A main component of the n⁺ type semiconductor layer 5a and the n⁻ type semiconductor layer 1a is silicon, silicon carbide, gallium arsenide, or gallium nitride.

Hereinafter, a case in which the main component of the n⁺ type semiconductor layer 5a and the n⁻ type semiconductor layer 1a is silicon will be described.

Next, a plurality of trenches Tr are formed on the n⁻ type semiconductor layer 1a. Subsequently, as illustrated in FIG. 2A, an upper surface of the n⁻ type semiconductor layer 1a and an inner wall of the trench Tr are thermally oxidized, and thus, the insulation layer 21a including silicon oxide is formed. A layer including silicon nitride may be further formed on the insulation layer 21a.

Next, a conductive layer including polysilicon is formed on the insulation layer 21a. By etching back the conductive layer, the FP electrode 11 which is provided inside of each of the trenches Tr is formed. Subsequently, an upper surface of the FP electrode 11 is thermally oxidized, and thus the insulation layer 22a is formed.

Figure 2B:
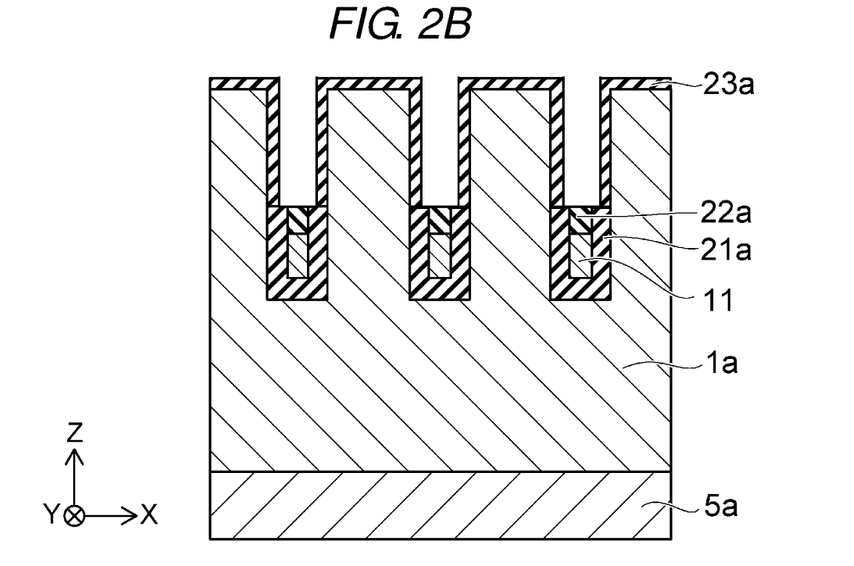

Next, the insulation layer 21a which is located higher than the insulation layer 22a is removed, and the upper surface of the n⁻ type semiconductor layer 1a and a part of the inner wall of the trench Tr are exposed. The exposed surfaces are thermally oxidized, and thus, the insulation layer 23a is formed as illustrated in FIG. 2B. A film thickness of the insulation layer 23a is thinner than, for example, a film thickness of the insulation layer 21a.

Figure 3A:
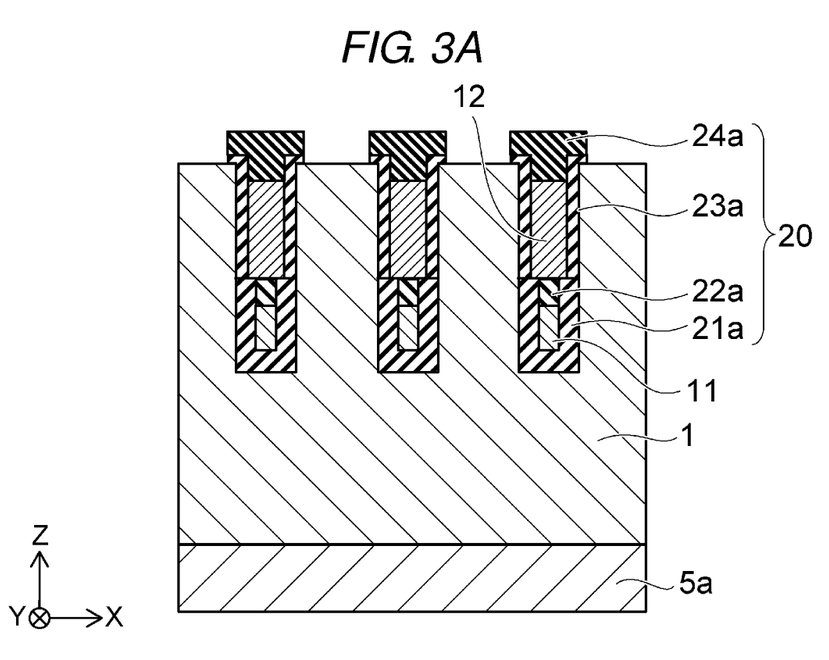
FIGS. 3A and 3B are cross-sectional views illustrating results of the manufacturing process of the semiconductor device according to the first embodiment.

Next, the conductive layer is formed on the insulation layer 22a and on the insulation layer 23a. By etching back the conductive layer, the gate electrode 12 which is provided inside each of the trenches Tr is formed. Subsequently, an insulation layer 24a covering the n⁻ type semiconductor layer 1a, the insulation layer 23a and the gate electrode 12 is formed. By patterning the insulation layers 23a and 24a, the insulation portion 20 including the insulation layers 21a to 24a is formed as illustrated in FIG. 3A.

Next, a p-type impurity and an n-type impurity are sequentially ion-implanted in the front surface FS of the n⁻ type semiconductor layer 1a, and the p⁻ type base region 2 and the n⁺ type source region 3 are formed. At this time, the p⁻ type base region 2 and the n⁺ type source region 3 are formed so that the n⁺ type source region 3 is positioned at one side of the insulation portion 20, and the first part 2a is positioned at the other side thereof. That is, the n⁺ type source region 3 is formed on only one side of the insulation portion 20. In the n⁻ type semiconductor layer 1a, a region other than the p⁻ type base region 2 and the n⁺ type source region 3 corresponds to the n⁻ type semiconductor region 1.

Figure 3B:
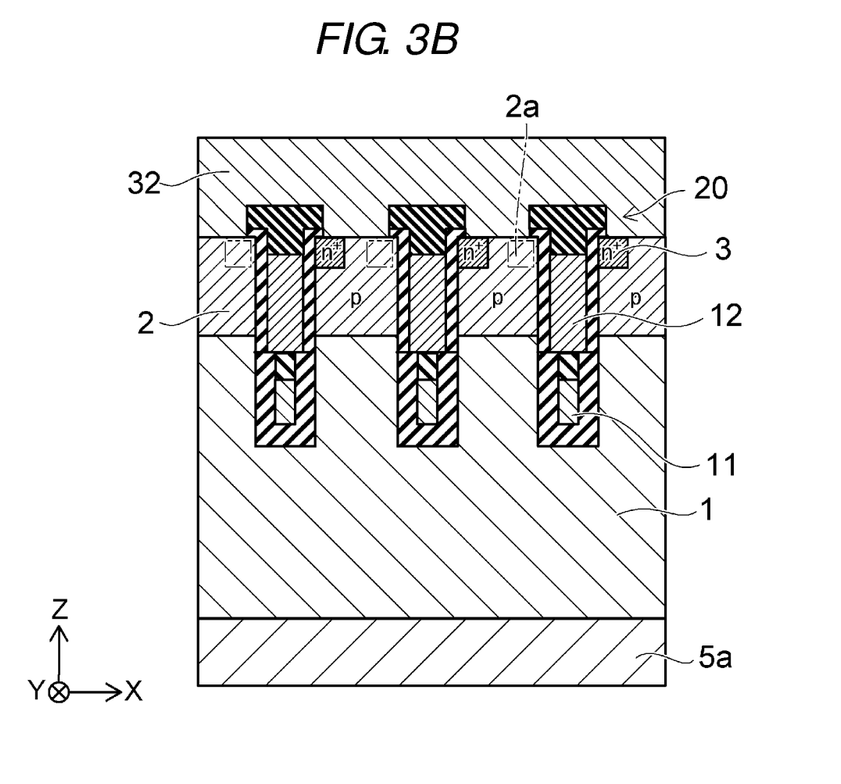

Next, a metal layer covering the semiconductor region and the insulation portion 20 is formed. By patterning the metal layer, the source electrode 32 is formed as illustrated in FIG. 3B.

Next, the back surface BS of the n⁺ type semiconductor layer 5a is ground until the n⁺ type semiconductor layer 5a achieves a predetermined thickness. The n⁺ type drain region 5 is formed by a process described above.

After that, the drain electrode 31 is formed under the n⁺ type drain region 5, thereby obtaining the semiconductor device 100 as illustrated in FIG. 1.

Here, an action and an effect according to the embodiment will be described.

According to the embodiment, heat-caused breakage of the semiconductor device can be suppressed while reducing the on-resistance of the semiconductor device.

Means for solving the above problems are as follows.

The semiconductor device includes the FP electrode 11, thereby making it possible to increase the breakdown voltage of the semiconductor device. For this reason, the impurity concentration in the n⁻ type semiconductor region 1 is increased as much as the breakdown voltage is increased by the FP electrode 11, and thus the on-resistance of the semiconductor device can be reduced.

At this time, as an interval between the FP electrodes 11 becomes narrower, the impurity concentration in the n⁻ type semiconductor region 1 can be increased.

Meanwhile, when making the interval between the FP electrodes 11 narrow, an interval between the gate electrodes 12 also becomes narrow. That is, an interval between the channels formed by the gate electrode 12 also becomes narrow. When making the interval between the channels narrow, overlapping of paths of current which flows in the n⁻ type semiconductor region 1 through the channel becomes significant. When overlapping of current paths becomes significant, an amount of heat generation in the n⁻ type semiconductor region 1 increases, and a possibility that heat-caused breakage of the semiconductor device also increases.

However, in the semiconductor device according to the embodiment, the first part 2a, which is arranged in the n⁺ type source region 3 in the X-direction and comes into contact with the insulation portion 20, is provided. In other words, the n⁺ type source region 3 is provided on only one side of the insulation portion 20.

By adopting such a configuration, the interval between the channels formed at the time of applying the voltage to the gate electrode 12 can be broadened. For this reason, overlapping of paths of the current, which flows in the n⁻ type semiconductor region 1 through each of the channels, is reduced, and the heat generation in the n⁻ type semiconductor region 1 is suppressed. As a result, the heat-caused breakage of the semiconductor device can be suppressed.

The heat generation by overlapping of the current paths can be a problem, for example, particularly, when a pitch between the gate electrodes 12 is 2.0 μm or less, and the impurity concentration in the n⁻ type semiconductor region 1 is $1.0 \times 10^{16}$ atm/cm³ or more. This is because, at the pitch between the gate electrodes 12 of 2 μm or less, the overlapping width of the current paths becomes significant, and, when the impurity concentration in the n⁻ type semiconductor region 1 is high, the current path in the n⁻ type semiconductor region 1 is likely to widen, and overlapping between the current paths becomes significant.

Accordingly, the embodiment is particularly effective in a semiconductor device which has the pitch between the gate electrodes 12 and the impurity concentration in the n⁻ type semiconductor region 1 as described above.

Meanwhile, between the insulation portions 20, in order to easily form the first part 2a and the n⁺ type source region 3, the pitch between the gate electrodes 12 is preferably 0.8 μm or more. Also, when the pitch between the gate electrodes 12 is 0.8 μm or more, from a point of the breakdown voltage of the semiconductor device, the impurity concentration in the n⁻ type semiconductor region 1 is preferably $8.0 \times 10^{16}$ atm/cm³ or less.

As used herein, "pitch" means an interval between the gate electrodes 12 which are arranged side by side. In an example illustrated in FIG. 1, the pitch is equal to a distance P between end portions of each of the gate electrodes 12 in the X-direction.

The n⁺ type source region 3 is provided on only one side of the insulation portion 20, and two first parts 2a and two n⁺ type source regions 3 can also be arranged alternatively in the X-direction. That is, two n⁺ type source regions 3 are provided on either side of a gate electrode 12 on a part of the p⁻ type base region 2, and the two first parts 2a can also be provided on either side of a gate electrode 12 on the other part of the p⁻ type base region 2.

However, as illustrated in FIG. 1, overlapping of the current paths can be further reduced, and the heat generation in the n⁻ type semiconductor region 1 can be further suppressed in a case in which the first part 2a and the n⁺ type source region 3 are arranged alternatively in the X-direction compared to a case in which the two first parts 2a and the two n⁺ type source regions 3 are arranged alternatively in the X-direction.

Modified Example

Figure 4:
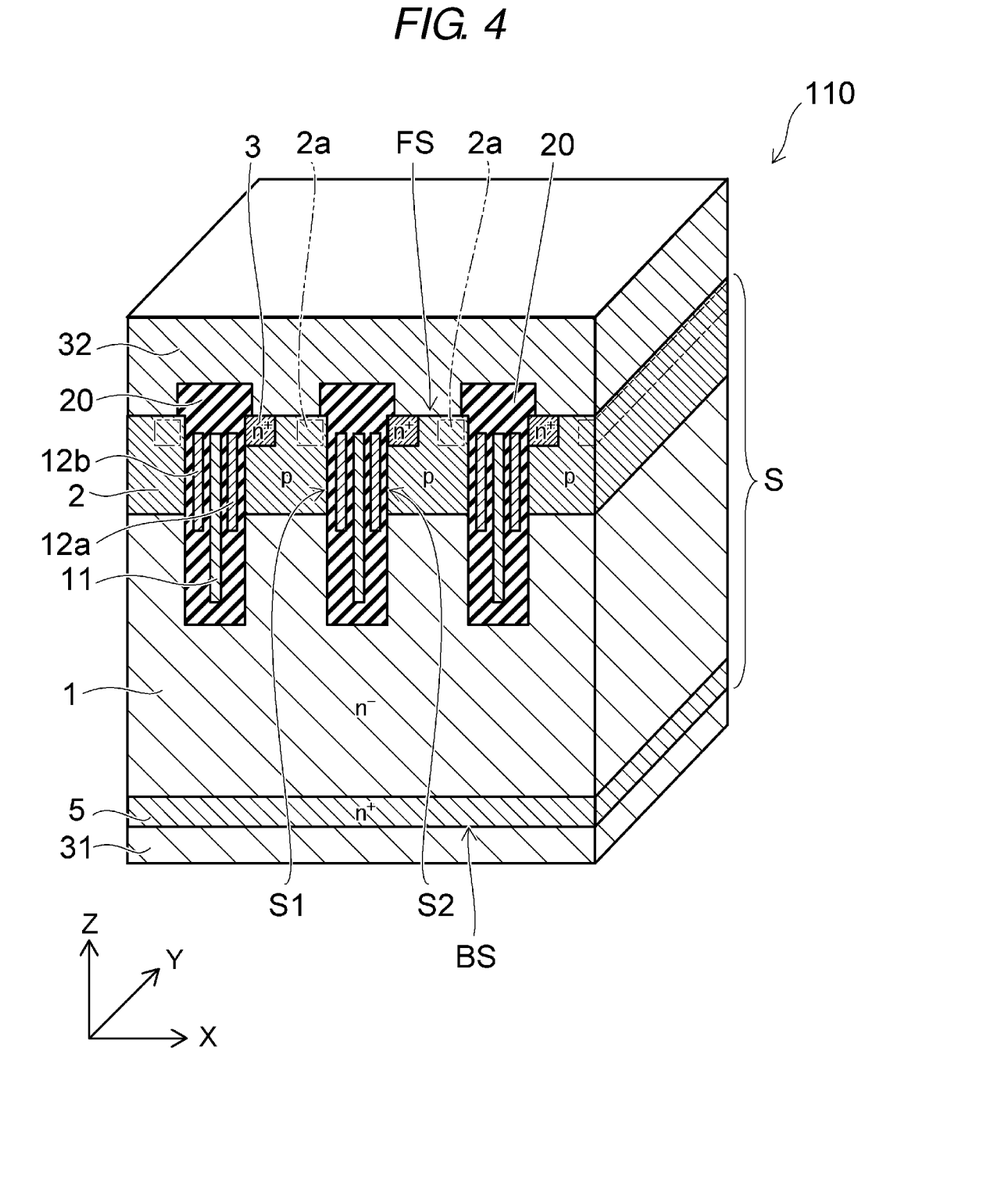
FIG. 4 is a perspective sectional view illustrating a part of the semiconductor device according to a modified example of the first embodiment.

With reference to FIG. 4, a part of the semiconductor device according to a modified example of the first embodiment will be described.

FIG. 4 is a sectional view illustrating a part of the semiconductor device 110 according to the modified example of the first embodiment.

The semiconductor device 110 according to the modified example has a different configuration of the FP electrode 11 and the gate electrode 12 compared to the semiconductor device 100.

Specifically, as illustrated FIG. 4, the semiconductor device 110 includes the FP electrode 11, the gate electrodes 12a and 12b which are separated from each other and arranged on either side of the FP electrode 11 in the X-direction in parallel with each other. The gate electrodes 12a and 12b are thus provided between the FP electrode 11 and each of the p⁻ type base regions 2.

Also in the embodiment, in the same manner in the embodiment illustrated in FIG. 1, since the n⁺ type source region 3 is provided on only one side of the insulation portion 20, on-resistance thereof can be reduced, and heat-caused breakage of the semiconductor device can be suppressed.

However, it is possible to further reduce areas of facing surfaces of the FP electrode 11 and the gate electrode 12 in a case in which the FP electrode 11 and the gate electrode 12 are spaced apart in the Z-direction, compared to a case in which the FP electrode 11 and the gate electrode 12 are spaced apart in the X-direction. When facing areas of the FP electrode 11 and the gate electrode 12 are reduced, a capacity between the FP electrode 11 (source electrode 32) and the gate electrode 12 can be reduced.

That is, according to the semiconductor device 100 illustrated in FIG. 1, compared to the semiconductor device 110 according to the modified example, when a voltage is applied to the gate electrode 12 until a voltage equal to or more than a threshold is applied to the gate electrode 12, a time during the semiconductor device is turned on can be reduced.

In addition, a length of the insulation portion 20 in the X-direction becomes greater in a case in which the FP electrode 11 and the gate electrode 12 are spaced in the Z-direction compared to a case in which the FP electrode 11 and the gate electrode 12 are spaced in the X-direction. For this reason, according to the semiconductor device 100 illustrated in FIG. 1, compared to the semiconductor device 110 according to the modified example, channel density increases, and thus the on-resistance can be reduced.

Meanwhile, when the channel density increases, as described above, heat generation amount due to overlapping of the current paths increases. Accordingly, suppressing the heat generation amount of the semiconductor device by providing the first part 2a is further effective in the semiconductor device 100 in which the FP electrode 11 and the gate electrode 12 are arranged in the Z-direction.

As illustrated in FIG. 4, when the FP electrode 11 and the gate electrode 12 are spaced apart in the X-direction, the heat generation due to overlapping of the current paths causes a problem particularly, for example, when the pitch between the gate electrodes 12 is equal to or less than 4.5 μm, and the impurity concentration in the n$^-$ type semiconductor region 1 is equal to or more than $0.5 \times 10^{16}$ atm/cm$^3$.

Accordingly, the modified example is effective particularly in the semiconductor device having the pitch between the gate electrodes 12 and the impurity concentration in the n$^-$ type semiconductor region 1 as described above.

Meanwhile, in order to easily form the first part 2a and the n$^+$ type source region 3 between the insulation portions 20, the pitch between the gate electrodes 12 is preferably 2.5 μm or more. In addition, when the pitch between the gate electrodes 12 is 2.5 μm or more, in terms of the breakdown voltage of the semiconductor device, the impurity concentration in the n$^-$ type semiconductor region 1 is preferably $2.5 \times 10^{16}$ atm/cm$^3$ or less.

Second Embodiment

An example of the semiconductor device according to a second embodiment will be described with reference to FIG. 5.

Figure 5:
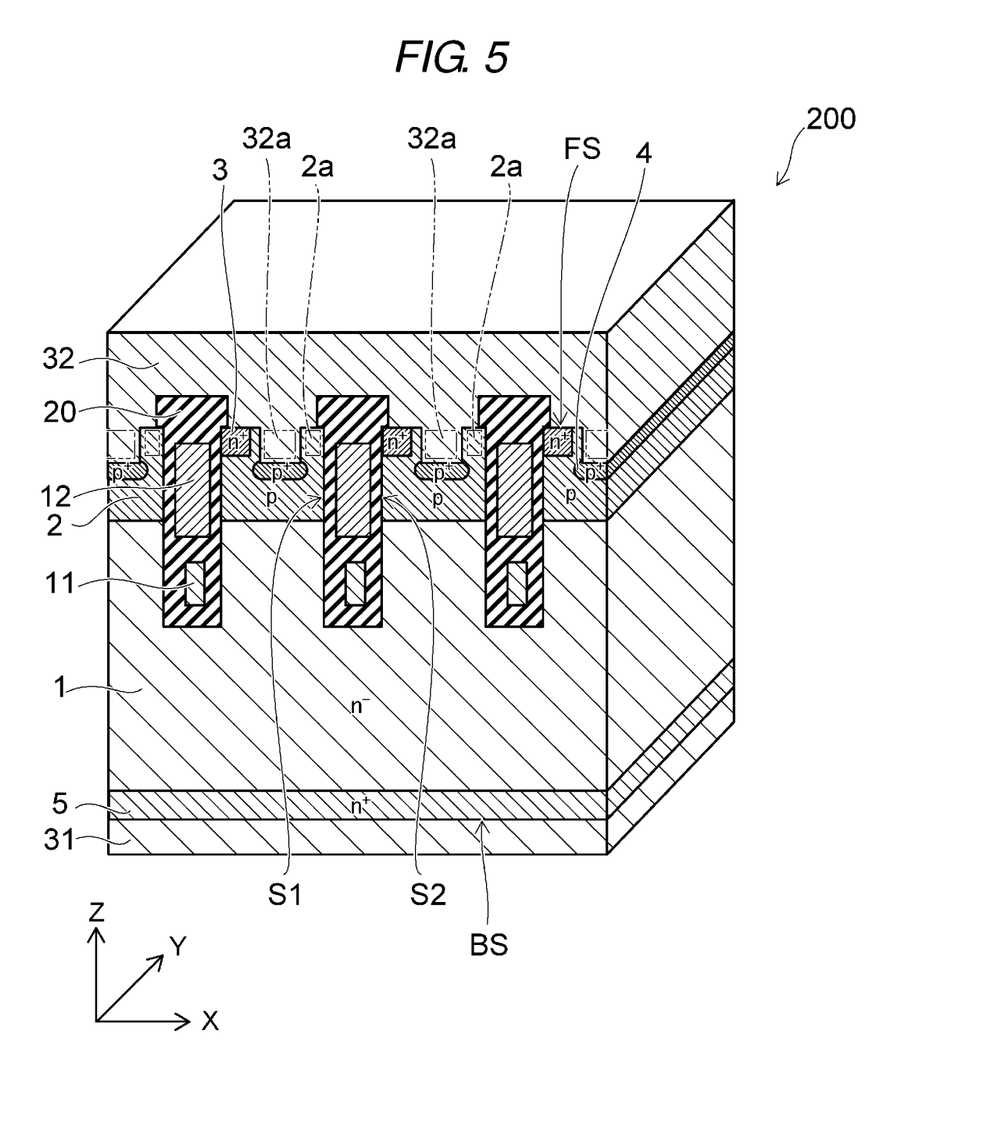
FIG. 5 is a perspective sectional view illustrating a part of the semiconductor device according to a second embodiment.

FIG. 5 is a sectional view illustrating a part of a semiconductor device 200 according to a second embodiment.

In the semiconductor device 200 according to a second embodiment, it is different in that the source electrode 32 includes a first electrode part 32a, and a p$^+$ type contact region 4 (fourth semiconductor region) is further included when compared to the semiconductor device 100.

As illustrated in FIG. 5, the source electrode 32 includes the first electrode part 32a provided between the first part 2a and the n$^+$ type source region 3. The first electrode part 32a is positioned between the adjacent insulation portions 20 in the X-direction.

Alternatively, the first part 2a is not only provided between the first electrode part 32a and the insulation portion 20, but the first electrode part 32a also comes into contact with the insulation portion 20.

The p$^+$ type contact region 4 is provided between the first electrode part 32a and the p$^-$ type base region 2. As illustrated in FIG. 5, a lower end of the first electrode part 32a may be surrounded by a part of the p$^+$ type contact region 4 along the X-Y plane.

The semiconductor device 200 can be manufactured by, for example, a method as follows.

First, processes same as the processes illustrated in FIG. 2A to FIG. 3A are performed. Subsequently, the p$^-$ type base region 2 and the n$^+$ type source region 3 are formed. Subsequently, apart of a region where the n$^+$ type source region 3 is not provided in the p$^-$ type base region 2 is removed, and a trench is formed.

When the p-type impurity is ion-implanted into a part of the p$^-$ type base region 2 through the formed trench, the p$^+$ type contact region 4 is formed. Subsequently, the metal layer is formed so as to embed the trench, and the source electrode 32 is formed. After that, in the same manner as a manufacturing method of the semiconductor device 100, a rear surface of the n$^+$ type semiconductor layer 5a is ground and the drain electrode 31 is formed, thereby obtaining the semiconductor device 200.

Here, actions and effects of the embodiment will be described.

When the semiconductor device 200 is turned off, a surge voltage is applied to the drain electrode 31 by an inductance of the semiconductor device 200. When a potential of the p$^-$ type base region 2 increases by the surge voltage, there is a case where a parasitic bipolar transistor included in the semiconductor device 200 enters a latch-up state. When the semiconductor device is used under a high temperature, current flowing when the parasitic bipolar transistor is in the latch-up state is also great, and the semiconductor device further generates heat by the current, whereby a possibility of the heat-caused breakage of the semiconductor device is likely to be increased.

In the embodiment, the semiconductor device includes the first electrode part 32a and p$^+$ type contact region 4, and thus an electric resistance between the p$^-$ type base region 2 and the source electrode 32 can be reduced. When the electric resistance between the p$^-$ type base region 2 and the source electrode 32 is reduced, the increase of the potential of the p$^-$ type base region 2 at the time of applying the surge voltage to the drain electrode 31 can be suppressed. For this reason, the latch-up state of the parasitic bipolar transistor is suppressed, and the heat-caused breakage of the semiconductor device is also suppressed.

Further, in the semiconductor device according to the embodiment, the first electrode part 32a is provided between the n$^+$ type source region 3 and the first part 2a. According to such a configuration, compared to a case in which the n$^+$ type source region 3 is formed on both sides of the insulation portion 20, and a part of the source electrode 32 is embedded between the n$^+$ type source regions 3, a length of the first electrode part 32a in the X-direction and a length of the p$^+$ type contact region 4 in the X-direction can be formed to be greater.

For this reason, compared to a case in which the n$^+$ type source region is provided on both side of the insulation portion 20, the electric resistance between the p$^-$ type base region 2 and the source electrode 32 can be further reduced.

In addition, in the embodiment, the first part 2a is formed between the first electrode part 32a and the insulation portion 20. By adopting such a configuration, when the trench for forming the first electrode part 32a is formed on the front surface of the base region 2, a possibility of etching the insulation portion 20 due to a deviation of a mask position, or the like can be reduced, and thus a yield of the semiconductor device can be improved.

Moreover, with respect to the semiconductor device 200 according to the embodiment, as a modified example of the first embodiment illustrated in FIG. 4, a structure in which the FP electrode 11 and the gate electrode 12 are arranged in the X-direction can be also applied.

In each of embodiments described above, a relative high and low level of the impurity concentration between each of the semiconductor regions can be recognized using, for example, a scanning capacitance microscope (SCM). Moreover, a concentration of carriers in each of the semiconductor regions can be the same as the impurity concentration active in each of the semiconductor regions. Accordingly, a relative high and low level of the concentration of the carriers between each of the semiconductor regions can be also recognized using the SCM.

In addition, the impurity concentration in each of the semiconductor region can be measured by, for example, a secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. In regard to a specific configuration of each of components such as the n+ type drain region 5, the n− type semiconductor region 1, the p− type base region 2, the n+ type source region 3, p+ type contact region 4, the FP electrode 11, the gate electrode 12, the insulation portion 20, the drain electrode 31, and the source electrode 32, which are included in the embodiment, a person skilled in the art can appropriately select from a well-known technology. In addition, each of the embodiments described above can be performed by combining with each other.

What is claimed is:

1. A semiconductor device, comprising:
a first semiconductor region of a first conductivity type;
a second semiconductor region of a second conductivity type on the first semiconductor region;
a gate electrode extending in a first direction from the second semiconductor region into the first semiconductor region;
a third semiconductor region of the first conductivity type in the second semiconductor region on one side of the gate electrode in a second direction;
an insulation portion surrounding the gate electrode and separating the first, second, and third semiconductor regions from the gate electrode;
a first electrode including a first portion and protruding portions extending in the first direction from the first portion into the second semiconductor region, the third semiconductor region being between a first one of the protruding portions and the gate electrode in the second direction, a first part of the second semiconductor region being between a second one of the protruding portions and the gate electrode in the second direction, the protruding portions each having a first part and a second part, a distance from the second part of the protruding portions to the insulation portion in the second direction being greater than a distance from the first part of the protruding portions to the insulation portion in the second direction;
a second electrode electrically connected to the first semiconductor region, the gate electrode being between the first and second electrodes in the first direction; and
a fourth semiconductor region of the second conductivity type in the second semiconductor region and adjacent to the protruding portions of the first electrode in the first direction, a concentration of carriers of the second conductivity type in the fourth semiconductor region being greater than a concentration of carriers of the second conductivity type in the second semiconductor region, wherein
a portion of the second semiconductor region is between the first one of the protruding portions and the third semiconductor region in the second direction.

2. The semiconductor device according to claim 1, wherein the third semiconductor region is only on the one side of gate electrode in the second direction and the first part of the second semiconductor region is only on another side of the gate electrode opposite the one side of gate electrode in the second direction.

3. The semiconductor device according to claim 1, wherein the gate electrode is between the third semiconductor region and the first part of the second semiconductor region in the second direction.

4. The semiconductor device according to claim 1, wherein the first part of the second semiconductor region has a carrier concentration of the second conductivity type that is the same as a carrier concentration of all other parts of the second semiconductor region outside the first part.

5. The semiconductor device according to claim 1, further comprising:
a field plate electrode in the insulation portion between the gate electrode and the second electrode in the first direction.

6. The semiconductor device according to claim 1, wherein the gate electrode is provided in the insulation portion as a first gate electrode portion and a second gate electrode portion separated from each other by the insulation portion in the second direction.

7. The semiconductor device according to claim 6, further comprising:
a field plate electrode in the insulation portion between the first gate electrode portion and the second gate electrode portion in the second direction.

8. The semiconductor device according to claim 7, wherein a bottommost portion of the field plate electrode is closer to the second electrode along the first direction than a bottommost portion of either of the first and second gate electrode portions.

9. The semiconductor device according to claim 1, wherein an impurity concentration of the first conductivity type in the first semiconductor region is within a range $1.0 \times 10^{16}$ atm/cm$^3$ to $8.0 \times 10^{16}$ atm/cm$^3$.

* * * * *